(12) United States Patent
Wu et al.

(10) Patent No.: US 7,173,289 B1
(45) Date of Patent: Feb. 6, 2007

(54) LIGHT EMITTING DIODE STRUCTURE HAVING PHOTONIC CRYSTALS

(75) Inventors: Liang-Wen Wu, Tao-Yung Hsien (TW); Ya-Ping Tsai, Tao-Yung Hsien (TW); Fen-Ren Chien, Tao-Yung Hsien (TW); Fu-Yu Chang, Tao-Yung Hsien (TW); Cheng-Tsang Yu, Tao-Yung Hsien (TW); Tzu-Chi Wen, Tao-Yung Hsien (TW)

(73) Assignee: Formosa Epitaxy Incorporation, Tao-Yung Hsien (TW)

( * ) Notice: Subject to any disclaimer, the term of this patent is extended or adjusted under 35 U.S.C. 154(b) by 0 days.

(21) Appl. No.: 11/223,654

(22) Filed: Sep. 8, 2005

(51) Int. Cl.
*H01L 33/00* (2006.01)
(52) U.S. Cl. .................... 257/98; 257/79; 257/E33.003
(58) Field of Classification Search .................. None
See application file for complete search history.

(56) References Cited

U.S. PATENT DOCUMENTS 6,803,603 B1 * 10/2004 Nitta et al. .................. 257/79
6,870,191 B2   3/2005 Niki et al. .................. 257/79

FOREIGN PATENT DOCUMENTS

JP          11-274568      10/1999
TW             561632      11/2003

* cited by examiner

*Primary Examiner*—Nathan J. Flynn
*Assistant Examiner*—Kevin Quinto
(74) *Attorney, Agent, or Firm*—J.C. Patents

(57) ABSTRACT

A light emitting diode (LED) structure includes a substrate with a surface and cylindrical photonic crystals, a first type doping semiconductor layer, a first electrode, a light emitting layer, a second type doping semiconductor layer and a second electrode. The first type doping semiconductor layer is formed on the substrate to cover the photonic crystals. The light emitting layer, the second type doping semiconductor layer and the second electrode are sequentially formed on a portion of the first type doping semiconductor layer. The first electrode is formed on the other portion of the first type doping semiconductor layer without being covered by the light emitting layer. Because the substrate with photonic crystals can improve the epitaxial quality of the first type doping semiconductor layer and increase the energy of the light forwardly emitting out of the LED, the light emitting efficiency of the LED is effectively enhanced.

20 Claims, 3 Drawing Sheets

LIGHT EMITTING DIODE STRUCTURE HAVING PHOTONIC CRYSTALS

BACKGROUND OF THE INVENTION

1. Field of Invention

The present invention relates to a light emitting device. More particularly, the present invention relates to a structure of a light emitting diode.

2. Description of Related Art

The light emitting diode (LED), in comparing with the conventional light bulb, has significantly advantages, such as small volume, long lifetime, low voltage/current driving, non-brittle property, having no thermal issue when emitting light, containing no Hg in considering issue of environmental contamination, light emitting efficiency in saving power, and so on. In addition, the light emitting efficiency of the LED is continuously increasing in recent years, and therefore the LED has gradually taken the place of light bulb or fluorescent lamp in some application field, such as the scanner lamp with high responding speed, the back light used in liquid crystal display, the control panel light in a car, the traffic light, or the usual illuminating apparatus.

In addition, since the III–V nitride compound is a material with a broad band gap. The emitted wavelength can cover from ultraviolet light to infrared light. In other words, it has covered the whole range of visible light. Therefore, the light emitting device using the III–V nitride compound semiconductor, such as GaN, GaAlN, or GaInN, has been widely applied in various light modules.

FIG. 1 is a cross-sectional view, schematically illustrating the conventional LED structure. In FIG. 1, the LED structure is basically formed from a substrate 110, an n-type doping semiconductor layer 120, an electrode 122, a light emitting layer 130, a p-type doping semiconductor layer 140, an ohmic contact layer 150, and another electrode 142. The n-type doping semiconductor layer 120, the light emitting layer 130, the p-type doping semiconductor layer 140, the ohmic contact layer 150, and the electrode 142 are sequentially formed over the substrate 110, and the light emitting layer 130 just cover a portion of the n-type doping semiconductor layer 120. The electrode 122 is disposed on the n-type doping semiconductor layer 120 at the portion not being covered by the light emitting layer 130.

Still referring to FIG. 1, when electrons from the n-type doping semiconductor layer 120 recombine with the electron-holes from the p-type doping semiconductor layer 140 at the light emitting layer 130, then a light 102 can be produced. A portion of the light 102 can transmit through the ohmic contact layer 150 and the substrate 110, and respectively emit out from the top and the bottom of the LED structure 100. In addition, another portion of the light 102 is reflected by the surface of the substrate 110 or several interfacing surfaces between the electrode 142 and the substrate 110. For example, the light transversely propagates in the n-type doping semiconductor layer 120 between the substrate 110 and the light emitting layer 130. In this situation, a portion of optical energy of the light 102 is absorbed by the n-type doping semiconductor layer 120, the p-type doping semiconductor layer 140, the electrode 122, and the electrode 142, resulting in a lower external quantum efficiency for the LED structure 100.

In order to solve the foregoing issue, the disclosure in JP 11-274568 uses the chemical mechanical polishing process and etching process to randomly roughen the substrate surface of the LED structure, so as to allow the incident light on the substrate is scattered and therefore increases the external quantum efficiency of the LED structure.

However, the way to randomly roughen the surface of the substrate does not effectively increase the external quantum efficiency of the LED structure. In one hand, that is because if the recessing pattern or the protruding pattern on the substrate surface is over large, then the crystal quality of the n-type doping semiconductor layer 120 growing from the substrate surface is reduced. As a result, the internal quantum efficiency of the LED structure is reduced, and therefore the external quantum efficiency cannot be increased. In another hand, the substrate surface being randomly roughened causes the optical energy in transverse propagation to be more easily absorbed by this roughened surface. It then causes the decay of light, emitted from the LED structure, and the external quantum efficiency cannot be sufficiently obtained.

SUMMARY OF THE INVENTION

The invention provides an LED structure, having a substrate of photonic crystal. The substrate with photonic crystal can have improved the epitaxial quality. The light propagating along the substrate surface can be reduced, and thereby the light emitting efficiency of the LED structure can be increased.

The invention provides an LED structure, including a substrate, a first type doping semiconductor layer, a first electrode, a light emitting layer, a second type doping semiconductor layer and a second electrode. The substrate has a surface and several cylindrical photonic crystals on the surface. The first type doping semiconductor layer is formed on the substrate to cover the photonic crystals. The light emitting layer is formed on a portion of the first type doping semiconductor layer. The second type doping semiconductor layer and the second electrode are sequentially formed on the light emitting layer. The first electrode is disposed on the first type doping semiconductor layer at a portion not being covered by the light emitting layer.

In an embodiment of the present invention, the foregoing LED structure includes, for example, an ohmic contact layer, which is disposed between the second type doping semiconductor layer and the second electrode.

In an embodiment of the present invention, diameters of the photonic crystals can be different or the same. Further, the photonic crystals are for example at leas one of protruding pattern and recess pattern.

In an embodiment of the present invention, the foregoing photonic crystals are, for example, on the substrate surface by a m×n array, wherein m and n are positive integer.

In an embodiment of the present invention, the foregoing photonic crystals are, for example, arranged into several odd rows and several even rows. The photonic crystals in each of the even rows are corresponding to intervals formed between adjacent two photonic crystals in the odd rows. Further in an embodiment, the interval between each adjacent two of the photonic crystals in the odd rows is, for example, different from an interval between adjacent two photonic crystals in the even rows. In addition, the array pattern of the photonic crystals can be that the photonic crystals in the odd rows are aligned to each other, and the photonic crystals of the $k^{th}$ row in the even rows are corresponding to the intervals between adjacent photonic crystals in the odd rows and also corresponding to the intervals between adjacent photonic crystals of the $k+1^{th}$ row in the even rows, wherein k is a positive integer.

In an embodiment of the present invention, the foregoing photonic crystals are for example arranged in a honeycomb shape on the substrate surface.

In an embodiment of the present invention, a portion of the photonic crystals are for example arranged in a honeycomb shape on the substrate surface, and surrounding the other portion of the photonic crystals. In an embodiment, diameters of the photonic crystals in the honeycomb shape are, for example, greater than the diameters of the photonic crystals for the other portion.

In an embodiment of the present invention, the substrate is, for example, sapphire, silicon carborundum, spinel, or silicon substrate.

In an embodiment of the present invention, the foregoing photonic crystals have a sized, for example, between 0.2 microns and 3 microns along the direction perpendicular to the substrate surface. The horizontal diameter of the photonic crystals is in a range, for example, 0.25 microns and 5 microns. In addition, the interval between adjacent two photonic crystals is, for example, in a rage of 0.5–10 microns.

In an embodiment of the present invention, materials for the first type doping semiconductor layer, the light emitting layer, and the second type doping semiconductor layer are, for example, III–V group compound semiconductor. For example, the III–V group compound semiconductor is GaN, GaP, or GaAsP.

In an embodiment of the present invention, the first type doping semiconductor layer is an n-type doping semiconductor layer. The second type doping semiconductor layer is a p-type doping semiconductor layer. In an embodiment of the present invention, the first type doping semiconductor layer is a P-type doping semiconductor layer. The second type doping semiconductor layer is an n-type doping semiconductor layer.

In the invention, the photonic crystals are formed on the substrate surface of the LED structure, so as to improve the epitaxial quality of the first type doping semiconductor layer and thereby increase the internal quantum efficiency of the LED structure. In addition, the photonic crystals of the invention can further increase the photo energy emitted at the forward direction of the LED structure, so as to increase the external quantum efficiency of the LED structure. As a result, the LED structure of the invention has sufficiently improved light emitting efficiency.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 2:
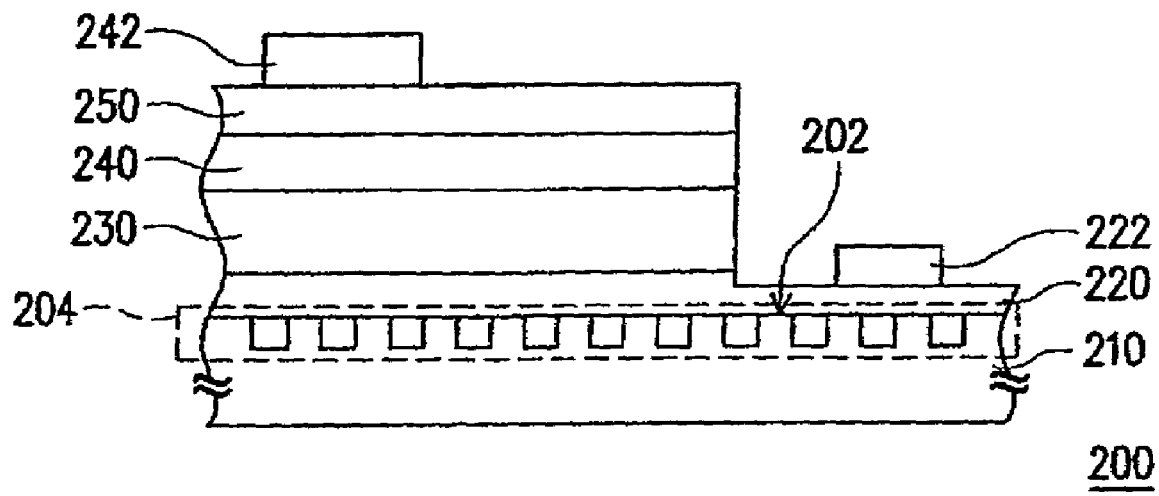
FIG. 2 is a cross-sectional view, schematically illustrating an LED structure, according to an embodiment of the invention.

FIG. 2 is a cross-sectional view, schematically illustrating an LED structure, according to an embodiment of the invention. In FIG. 2, the LED structure 200 includes a substrate 210, a first type doping semiconductor layer 220, an electrode 222, a light emitting layer 230, a second type doping semiconductor layer 240 and an electrode 242. A material for the substrate 210 includes, for example, sapphire, silicon carborundum, spinel, or silicon substrate. The substrate 210 has a surface 202 and cylindrical photonic crystals 204 on the substrate 202.

In the foregoing descriptions, the photonic crystals 204 are for example a protruding pattern or a recess pattern. The photonic crystals 204 are formed by, for example, performing photolithographic and etching processes, so as to form the cylindrical protruding pattern or cylindrical recess pattern on the surface 202. Particularly, the photonic crystals 204 are periodically arranged on the surface 202 of the substrate 210. The interval between the adjacent two photonic crystals is, for example, in a range of 0.5–10 microns.

In addition, the diameter of the photonic crystals 204 is, for example, in a range of 0.25–5 microns. Further, a size of the photonic crystals 204 along the direction perpendicular to the substrate is, for example, in a range of 0.2–3 microns. In other words, the photonic crystals 204 in the protruding pattern has a height, for example, in a range of 0.2–3 microns, or the photonic crystals 204 in the recess pattern has a depth, for example, in a range of 0.2–3 microns.

Still referring to FIG. 2, the first type doping semiconductor layer 220 is disposed over the substrate 210 to cover the photonic crystals 204. Particularly, the first type doping semiconductor layer 220 is formed on the surface 202 of the substrate 210 at the protruding portion but does not fill into the recess pattern. Remarkably, in the process for forming the first type doping semiconductor layer 220, the photonic crystals 204 are periodically arranged on the surface 202 of the substrate 210 and can suppress the locally crystal defect on the first type doping semiconductor layer 220. This can reduce the dislocation and increase the epitaxial crystal quality, and further increase the internal quantum efficiency of the LED structure 200.

Still referring to FIG. 2, the light emitting layer 230, the second type doping semiconductor layer 240, and the electrode 242 are sequentially disposed over a portion of the first type doping semiconductor layer 220. The electrode 222 is disposed over the first type doping semiconductor layer 220 at a portion not being covered by the light emitting layer 230. In the embodiment, the first type doping semiconductor layer 220 is, for example, n-type doping semiconductor layer 220, and the second type doping semiconductor layer 240 is, for example, p-type doping semiconductor layer 240. Understandably, in the other embodiment, the first type doping semiconductor layer 220 is, for example, p-type doping semiconductor layer 220, and the second type doping semiconductor layer 240 is, for example, n-type doping semiconductor layer 240. In addition, the light emitting layer 230 is, for example, a layer of multi-quantum well.

In addition, the first type doping semiconductor layer 220, the light emitting layer 230, and the second type doping semiconductor layer 240 are, for example, formed by a material of III–V group compound semiconductor. In this embodiment, the first type doping semiconductor layer 220, the light emitting layer 230, and the second type doping semiconductor layer 240 are, for example, formed by GaN, GaP, or GaAsP.

Moreover, in the invention, an ohmic contact layer 250 is formed between the electrode 242 and the second type doping semiconductor layer 240, so as to improve the current conducting uniformity on the first type doping semiconductor layer 220, the light emitting layer 230, and the second type doping semiconductor layer 240. In the embodiment, the ohmic contact layer 250 is, for example, the p-type ohmic contact layer.

The photonic crystals 204 in periodical arrangement on the surface 202 of the substrate 210 can improve the epitaxial quality of the first type doping semiconductor layer 220 and can lead the transversely propagating light between the first type doping semiconductor layer 220 and the second type doping semiconductor layer 240 into the forwarding light, so that the forwarding light can emit out from the LED structure 200 and the external quantum efficiency is effectively increased. Remarkably, the photonic crystals 204 of the invention has several periodical arrangements. The following descriptions will describe various arrangements of the photonic crystals 204 as the example.

Figure 3A:
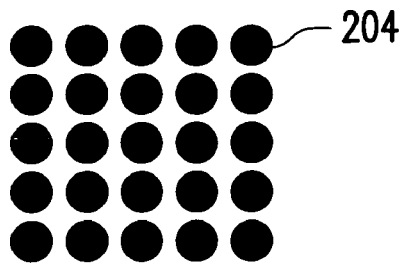
FIGS. 3A–3K are top views, schematically illustrating the arrangement of the photonic crystals.
Figure 3B:
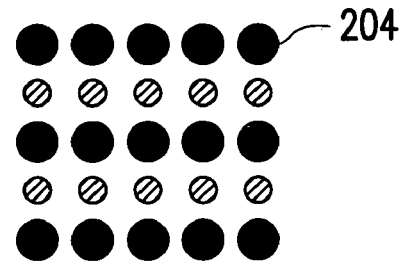
Figure 3C:
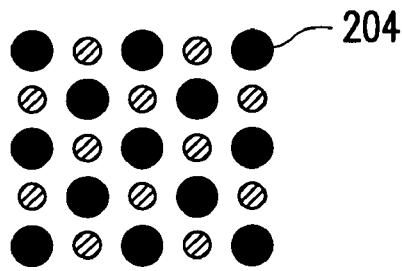

FIGS. 3A–3K are top views, schematically illustrating the arrangement of the photonic crystals. Referring to FIG. 3A, in the invention, the photonic crystals 204 are, for example, arranged in an array of m×n matrix, where m and n are positive integers. Particularly, diameters of the photonic crystals 204 can be the same or different. With respect to the m×n matrix for photonic crystals 204, the photonic crystals 204 in the odd rows can be different, in diameter, with the photonic crystals 204 in the even rows, as shown in FIG. 3B. In addition, as shown in FIG. 3C, The photonic crystal 204 located at the position (p, q) can be different, in diameter, with the photonic crystals 204 located at the positions (p+1, q) and (p, q+1). P and q are positive integer and $1 \leq p \leq m-1$, $1 \leq q \leq n-1$.

Figure 3D:
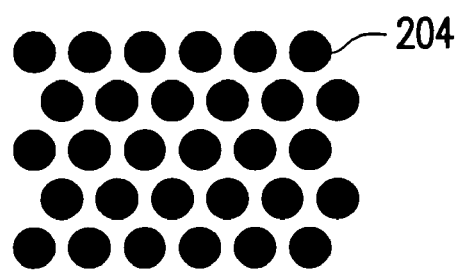
Figure 3E:
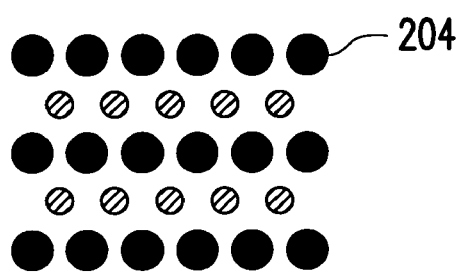

In addition to the arrangement in matrix, the photonic crystals 204 can also be arranged in a way that the odd rows and the even rows are not aligned in column direction. For example, as shown in FIG. 3D, the photonic crystals 204 in each odd row in column direction are aligned. The photonic crystals 204 in each even row are corresponding to the intervals between adjacent two photonic crystals 204 in the odd row. Certainly, the diameters of the photonic crystals 204 in the even row can be different from the diameters of he photonic crystals 204 in the odd rows, as shown in FIG. 3E.

Figure 3F:
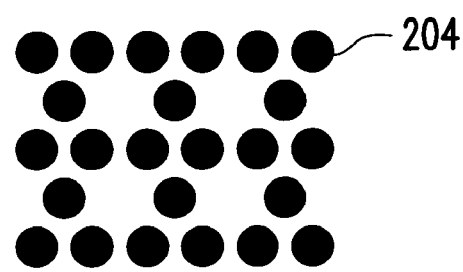
Figure 3G:
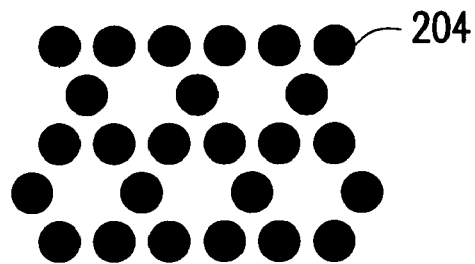

In FIGS. 3A–3E, the intervals of the photonic crystals 204 in the even row are equal to the intervals of the photonic crystals 204 in the odd row. In another embodiments, the intervals of the photonic crystals 204 in the even row can be different to the intervals of the photonic crystals 204 in the odd row. As shown in FIG. 3F and FIG. 3G, the intervals of the photonic crystals 204 in the even row are, for example, twice of the intervals of the photonic crystals 204 in the odd row. The photonic crystals 204 in the even row are, for example, corresponding to a space between adjacent two photonic crystals 204 in the odd row. Remarkably, here, the term of "interval" means the distance between adjacent two photonic crystals 204, counting from the center points. The term of "space" means the separation of the adjacent two photonic crystals 204, counting from the edges.

Figure 3H:
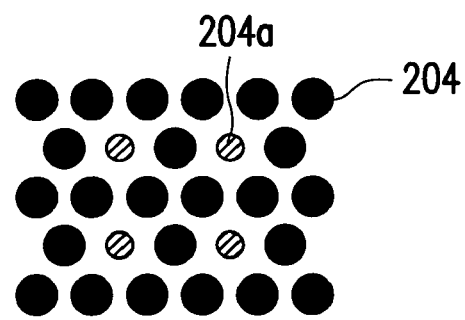
Figure 3I:
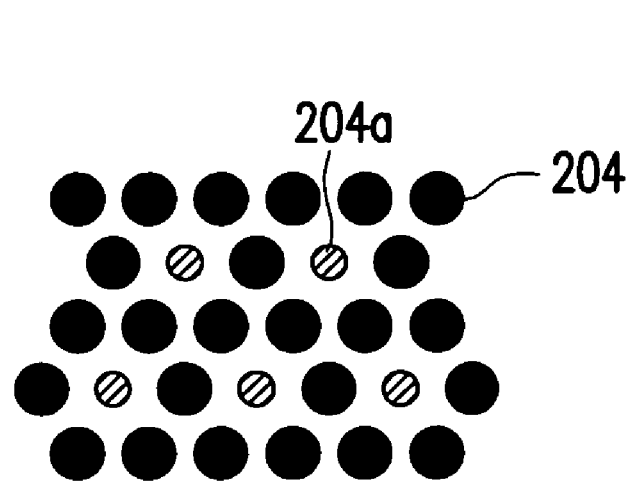

In more details, as shown in FIG. 3F, the photonic crystals 204 in the odd rows are aligned in the column direction, and the photonic crystals 204 in the even rows are also aligned in the column direction. In addition, as shown in FIG. 3G, the photonic crystals 204 in the odd rows are aligned in the column direction. However, the photonic crystals of the $k^{th}$ row in the even rows are corresponding to the intervals between adjacent two photonic crystals in the odd rows and also corresponding to the intervals between adjacent two photonic crystals of the $k+1^{th}$ row in the even rows. Particularly, for the other embodiments in the invention as shown in FIGS. 3H and 3I, some photonic crystals 204a in smaller diameter can be disposed between the photonic crystals 204 in the even rows of FIG. 3F and FIG. 3G.

Figure 3J:
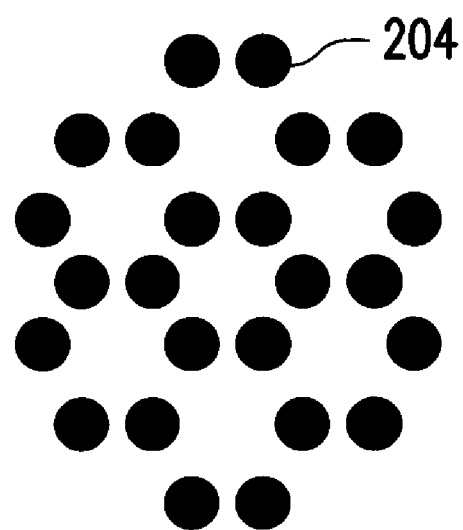
Figure 3K:
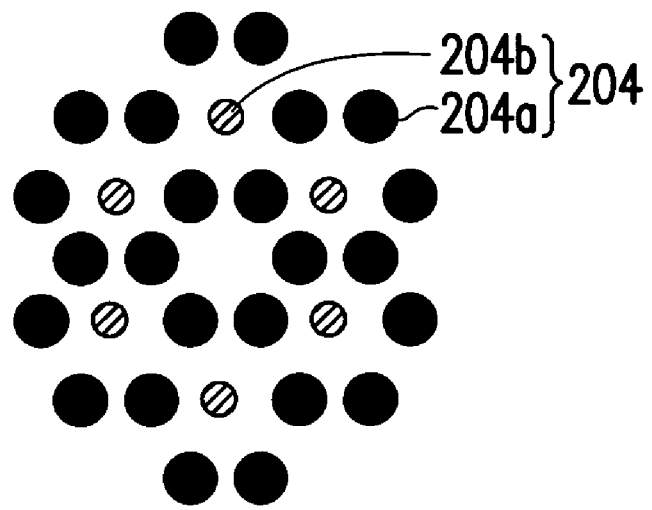

Further still, the photonic crystals 204 of the invention can also be an arrangement in honeycomb shape on the substrate surface, as shown in FIG. 3J. In another embodiment, a portion in photonic crystals 204b can also be surrounded by the another portion in photonic crystals 204a, which are arranged in the honeycomb shape, as shown in FIG. 3K. The diameter of the photonic crystals 204a is, for example, greater than the diameter of the photonic crystals 204b.

It should be noted that, FIG. 3A to FIG. 3K are just the examples for descriptions. The photonic crystals 204 in the invention can be any periodical arrangement on the surface 202 of the substrate 200. The drawings are not used to limit the arrangement of the photonic crystals 204 in the invention.

Table 1 and Table 2 show the experiment results of light emitting efficiency for the LED structure with the photonic crystals in the invention, according to the arrangements in FIG. 3A–FIG. 3K, so that the improvement of the novel LED structure of the invention in comparing with the conventional LED structure can be easily found by the ordinary skilled artisans. In Table 1, the LED bare chip, according to the invention, with emitting line at 465 nm is taken for test. Table 2 is a test after the LED structure has been packaged. The input current in test is 20 mA. In addition, the light emitting efficiency listed in Table 1 and Table 2 are the relative values to the conventional LED structure as shown in FIG. 1.

TABLE 1

Figure 1:
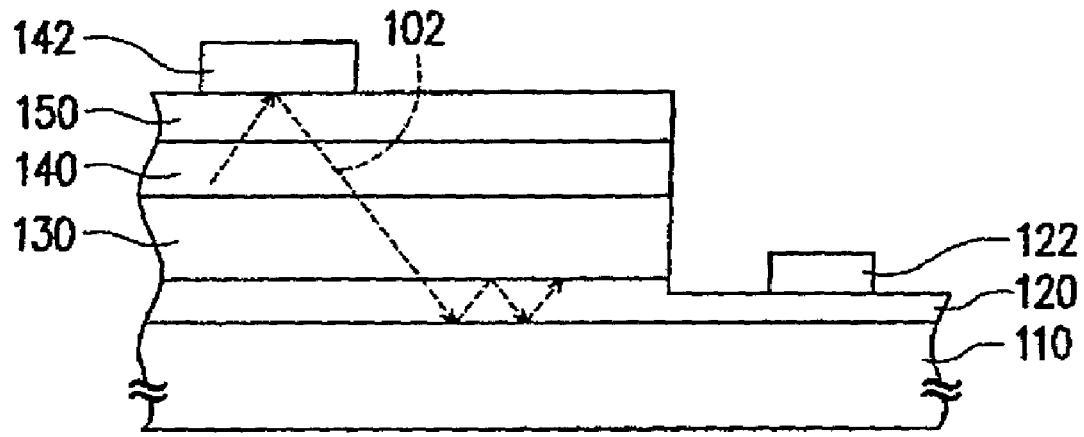
FIG. 1 is a cross-sectional view, schematically illustrating the conventional LED structure.

| FIG. 1 | 3A | 3B | 3C | 3D | 3E | 3F | 3G | 3H | 3I | 3J | 3K |
| --- | --- | --- | --- | --- | --- | --- | --- | --- | --- | --- | --- |
| 1 | 1.53 | 1.56 | 1.56 | 1.61 | 1.66 | 1.53 | 1.56 | 1.54 | 1.56 | 1.61 | 1.70 |

TABLE 2

| FIG. 1 | 3A | 3B | 3C | 3D | 3E | 3F | 3G | 3H | 3I | 3J | 3K |
| --- | --- | --- | --- | --- | --- | --- | --- | --- | --- | --- | --- |
| 1 | 1.21 | 1.21 | 1.25 | 1.27 | 1.30 | 1.23 | 1.23 | 1.23 | 1.31 | 1.33 | 1.38 |

From table 1 and table 2, the LED structure of the invention in comparison with the conventional LED structure has the improved light emitting efficiency.

In summary, the invention, the LED structure of the invention is forming the cylindrical photonic crystals on the substrate surface in periodical arrangement, so as to have periodical refractive index on the substrate surface. As a result, when the light emitted from the light emitting layer reaches to the substrate surface, the light is diffracted by the photonic crystals and emits out from the up side or the down side of the substrate. This decreases the loss of optical energy due to transverse propagation between the first type doping semiconductor layer and the second type doping semiconductor layer. The external quantum efficiency of the LED structure is therefore improved.

In addition, the photonic crystals on the substrate surface can suppress the formation of local crystal defects on the first type doping semiconductor layer. Thereby, the epitaxial quality is improved and the dislocation is reduced, so as to improve the internal quantum efficiency of the LED structure. As a result, the LED structure of the invention has the sufficient good light emitting efficiency.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A light emitting diode (LED) structure, comprising:
   a substrate, having a surface and a plurality of photonic crystals arranged on the surface;
   a first type doping semiconductor layer, disposed over the substrate at the surface with the plurality of photonic crystals and covering the photonic crystals;
   a light emitting layer, disposed on a portion of the first type doping semiconductor layer;
   a second type doping semiconductor layer, disposed over the light emitting layer;
   a first electrode, disposed on the first type doping semiconductor layer at a portion not being covered by the light emitting layer; and
   a second electrode, disposed over the second type doping semiconductor layer.

2. The LED structure of claim 1, further comprising an ohmic contact layer, disposed between the second type doping semiconductor layer and the second electrode.

3. A light emitting diode (LED) structure, comprising:
   a substrate, having a surface and a plurality of photonic crystals;
   a first type doping semiconductor layer, disposed over the substrate and covering the photonic crystals;
   a light emitting layer, disposed on a portion of the first type doping semiconductor layer;
   a second type doping semiconductor layer, disposed over the light emitting layer;
   a first electrode, disposed on the first type doping semiconductor layer at a portion not being covered by the light emitting layer; and
   a second electrode, disposed over the second type doping semiconductor layer, wherein the photonic crystals have different diameters.

4. A light emitting diode (LED) structure, comprising:
   a substrate, having a surface and a plurality of photonic crystals;
   a first type doping semiconductor layer, disposed over the substrate and covering the photonic crystals;
   a light emitting layer, disposed on a portion of the first type doping semiconductor layer;
   a second type doping semiconductor layer, disposed over the light emitting layer;
   a first electrode, disposed on the first type doping semiconductor layer at a portion not being covered by the light emitting layer; and
   a second electrode, disposed over the second type doping semiconductor layer, wherein the photonic crystals have the same diameters.

5. The LED structure of claim 1, wherein the photonic crystals comprise one of protruding pattern and recess pattern.

6. The LED structure of claim 1, wherein the photonic crystals are arranged on the surface of the substrate by an array of m×n matrix, where m and n are positive integers.

7. The LED structure of claim 1, wherein the photonic crystals are arranged into a plurality of odd rows and a plurality of several even rows, and the photonic crystals in each of the even rows are corresponding to a plurality of intervals formed between adjacent two photonic crystals in the odd rows.

8. The LED structure of claim 7, wherein the intervals between each adjacent two of the photonic crystals in the odd rows is different from a plurality of intervals between each adjacent two of the photonic crystals in the even rows.

9. The LED structure of claim 8, wherein the photonic crystals in the odd rows are aligned to each other, and the photonic crystals of the $k^{th}$ row in the even rows are corresponding to the intervals between adjacent two photonic crystals in the odd rows and also corresponding to the intervals between adjacent two photonic crystals of the $k+1^{th}$ row in the even rows, wherein k is a positive integer.

10. The LED structure of claim 1, wherein the photonic crystals are arranged in a honeycomb shape on the surface of the substrate.

11. The LED structure of claim 1, wherein a first portion of the photonic crystals are arranged in a honeycomb shape on the surface of the substrate, and surrounds a second portion of the photonic crystals other than the first portion.

12. The LED structure of claim 11, wherein a diameter of the photonic crystals in the honeycomb shape is greater than a diameter of the photonic crystals for the second portion.

13. The LED structure of claim 1, wherein a material for the substrate comprises sapphire, silicon carborundum, spinel, or silicon substrate.

14. The LED structure of claim 1, wherein the photonic crystals has a size between 0.2 microns and 3 microns along a direction perpendicular to the substrate.

15. The LED structure of claim 1, wherein a diameter of the photonic crystals is in a range between 0.25 microns and 5 microns.

16. The LED structure of claim 1, wherein the interval between the adjacent two photonic crystals is in a range of 0.5–10 microns.

17. The LED structure of claim 1, wherein a material for the first type doping semiconductor layer, the light emitting layer, and the second type doping semiconductor layer is III–V group compound semiconductor.

18. The LED structure of claim 17, wherein the III–V group compound semiconductor comprises GaN, GaP, or GaAsP.

19. The LED structure of claim 1, wherein the first type doping semiconductor layer is an n-type doping semiconductor layer and the second type doping semiconductor layer is a p-type doping semiconductor layer.

20. The LED structure of claim 1, wherein the first type doping semiconductor layer is a P-type doping semiconductor layer, and the second type doping semiconductor layer is an n-type doping semiconductor layer.

* * * * *